(12) United States Patent
Lähteensuo et al.

(10) Patent No.: US 9,906,204 B2
(45) Date of Patent: Feb. 27, 2018

(54) TUNABLE FILTER OFF-STATES FOR NOISE REJECTION

(71) Applicant: Nokia Technologies Oy, Espoo (FI)

(72) Inventors: Toni H. Lähteensuo, Mountain View, CA (US); Brecht Francois, Santa Clara, CA (US); Niels Bonne Larsen, Sunnyvale, CA (US); Lingkai Kong, Palo Alto, CA (US)

(73) Assignee: Nokia Technologies Oy, Espoo (FI)

( * ) Notice: Subject to any disclaimer, the term of this patent is extended or adjusted under 35 U.S.C. 154(b) by 241 days.

(21) Appl. No.: 14/714,122

(22) Filed: May 15, 2015

(65) Prior Publication Data

US 2016/0336631 A1 Nov. 17, 2016

(51) Int. Cl.
*H03H 7/46* (2006.01)
*H01P 1/201* (2006.01)
*H01P 1/10* (2006.01)
*H01P 5/12* (2006.01)
*H04B 1/04* (2006.01)
*H04B 1/10* (2006.01)

(52) U.S. Cl.
CPC ............. *H03H 7/465* (2013.01); *H01P 1/10* (2013.01); *H01P 1/201* (2013.01); *H01P 5/12* (2013.01); *H04B 1/0475* (2013.01); *H04B 1/10* (2013.01)

(58) Field of Classification Search
CPC ...... H01P 1/202; H01P 1/2056; H01P 1/2053; H01P 1/205; H01P 7/04; H01P 1/208; H01P 1/207; H01P 1/209; H01P 1/2082; H01P 7/06; H03H 7/465

USPC ................ 333/207, 209, 208, 202, 174, 205
See application file for complete search history.

(56) References Cited

U.S. PATENT DOCUMENTS

| | | | |
|---|---|---|---|
| 8,682,260 B1 | 3/2014 | Granger-Jones et al. | |
| 2008/0045152 A1* | 2/2008 | Boes ..................... | H04W 16/14 455/63.1 |
| 2012/0302188 A1 | 11/2012 | Sahota et al. | |
| 2013/0225107 A1 | 8/2013 | Lane et al. | |
| 2014/0055210 A1 | 2/2014 | Black et al. | |
| 2014/0167877 A1 | 6/2014 | Shimizu et al. | |
| 2014/0307592 A1* | 10/2014 | Khlat .................... | H04L 5/1461 370/278 |

FOREIGN PATENT DOCUMENTS

EP 1143690 A2 10/2001
WO WO-2013097743 A1 7/2013

* cited by examiner

*Primary Examiner* — Benny Lee
*Assistant Examiner* — Hafizur Rahman
(74) *Attorney, Agent, or Firm* — Mintz Levin Cohn Ferris Glovsky and Popeo, P.C.

(57) ABSTRACT

Methods and apparatus, including computer program products, are provided for tunable filters and/or front-ends. In one aspect there is provided an apparatus. The apparatus may a first band filter; a second tunable band filter; and a radio frequency switch coupled to at least the first band filter and the second tunable band filter, wherein the radio frequency switch is configured to switch between at least the first band filter and the second tunable band filter. Related apparatus, systems, methods, and articles are also described.

17 Claims, 4 Drawing Sheets

TUNABLE FILTER OFF-STATES FOR NOISE REJECTION

FIELD

The subject matter disclosed herein relates to wireless communications.

BACKGROUND

In a radio-based system, noise may take many forms and arise from a variety of sources. But in most cases, noise is something that radios tend to at least control, if not suppress or eliminate. Indeed, noise can degrade the performance of a radio frequency (RF) front-end.

SUMMARY

Methods and apparatus, including computer program products, are provided for tunable filters and/or radio frequency front-ends.

In some example embodiments, there is provided an apparatus. The apparatus may include a first band filter; a second tunable band filter; a radio frequency switch coupled to at least the first band filter and the second tunable band filter, wherein the radio frequency switch is configured to switch between at least the first band filter and the second tunable band filter; and a controller configured to at least: initiate selection, at the radio frequency switch, of the first band filter to enable transmission through the radio frequency switch, the first band filter, and an antenna, determine whether a first pass band of the first band filter includes at least a partial overlap in frequency with a second pass band of the second tunable band filter, and initiate tuning of the second tunable band filter to adjust the second pass band of the second tunable band filter to enable suppression of a leakage signal, when the first pass band includes at least the partial overlap in frequency with the second pass band.

In some example embodiments, one of more variations may be made as well as described in the detailed description below and/or as described in the following features. The tuning of the second tunable band filter may be inhibited, when the first pass band does not have the partial overlap in frequency with the second pass band. The apparatus may further include an antenna switch coupled to at least the first band filter and the second tunable band filter. The antenna switch may be configured to switch between at least the first band filter and the second tunable band filter in order couple to an antenna. The first band filter may be tunable. At least one of the first band filter or the second band filter may include a filter at least partially specified by at least one of a standard or regulatory agency. The leakage signal may represent a signal of interest that couples to an unselected switch path at the radio frequency switch. At least one of the first band filter or the second band filter may include a transmit bandpass filter, a receive bandpass filter, or a combination of both. The radio frequency switch may be coupled to at least one additional band filter to enable path establishment to the antenna.

It is to be understood that both the foregoing general description and the following detailed description are exemplary and explanatory only and are not restrictive. Further features and/or variations may be provided in addition to those set forth herein. For example, the implementations described herein may be directed to various combinations and subcombinations of the disclosed features and/or combinations and subcombinations of several further features disclosed below in the detailed description.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the subject matter disclosed herein. In the drawings.

Figure 1:
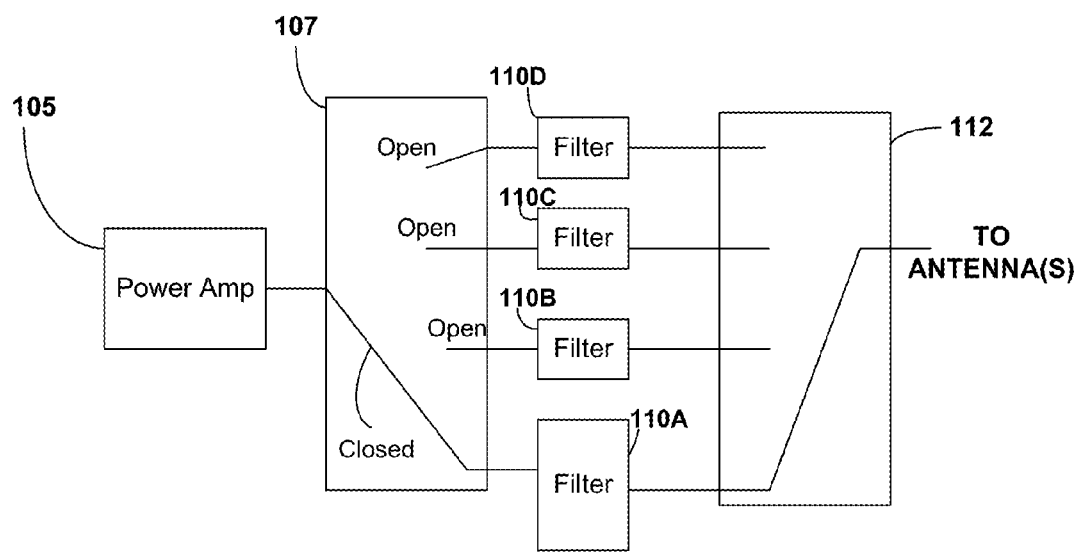
FIG. 1 depicts an example of a radio frequency front-end.

Like labels are used to refer to same or similar items in the drawings.

DETAILED DESCRIPTION

A tunable radio frequency (RF) front-end may enable tuning of a receiver in order to transmit or receive at different frequencies. The tunable RF front-end may be a component in radios including smartphones and other types of user equipment. To reduce RF front-end component count, one or more switches may be used to couple a single RF power amplifier to one of a plurality of band filters and/or to couple the band filter(s) to one or more antennas. However, a switch may generate noise, and this noise may also leak into unintended (or unwanted) paths through the switch.

FIG. 1 depicts an example of a system 100 including a power amplifier 105 coupled to a front-end switch 107, which can select among band filters, such as a band 7 filter 110A, a band 40 filter 110B, a band 41 filter 110C, and a band 38 110D filter, although filters of other types and frequency ranges may be used as well. The band filters 110A-D may comprise passband filters configured to have a preconfigured passband. For example, band 7 filter 110A may be a long term evolution (LTE) band 7 duplex filter having a passband and other aspects specified by a standard or other regulatory body. The band filters may be coupled to antenna switch 112, which also selects among the bands.

In the example of FIG. 1, front-end switch 107 may select first band filter 110A (B7) for transmission and/or reception (which in this example may have a passband bandwidth of 2500-2570 MHz and a receive passband at 2620-2690 MHz). However, the selected band filter 110A (B7) in this example has at least a partial overlaps with third band filter 110C (B41) having a passband at 2496-2690 MHz. The front-end switch may select band B7 filter 110A to couple it to switch 112 to enable transmission or reception via an antenna. But even though the front-end switch has not coupled (as shown by the open switch) the third band filter 110C (B41), leakage noise at the front-end switch may traverse or couple through the front-end switch to the antenna causing noise or interference on the selected band, B7. Indeed, the signal (which is switched to selected band B7 filter 110A) may operate at high power due to the power amplifier, which may contribute to the noted noise leakage.

Although some of the examples describe herein refer to specific cellular bands, other types of radio bands may be used as well.

In some example embodiments, there is provided an apparatus including a radio frequency (RF) front-end having tunable filters that can reject the noise leakage caused by non-selected bands interfering with a selected band. In some example embodiments, a tunable filter for the non-selected band may be tuned to attenuate or suppress front-end noise leakage, when the non-selected band filter has at least a partially overlapping passband with the selected band filter. This may provide for example 30-40 dB isolation for the noise leakage path, although other suppression values may be realized as well.

Figure 2:
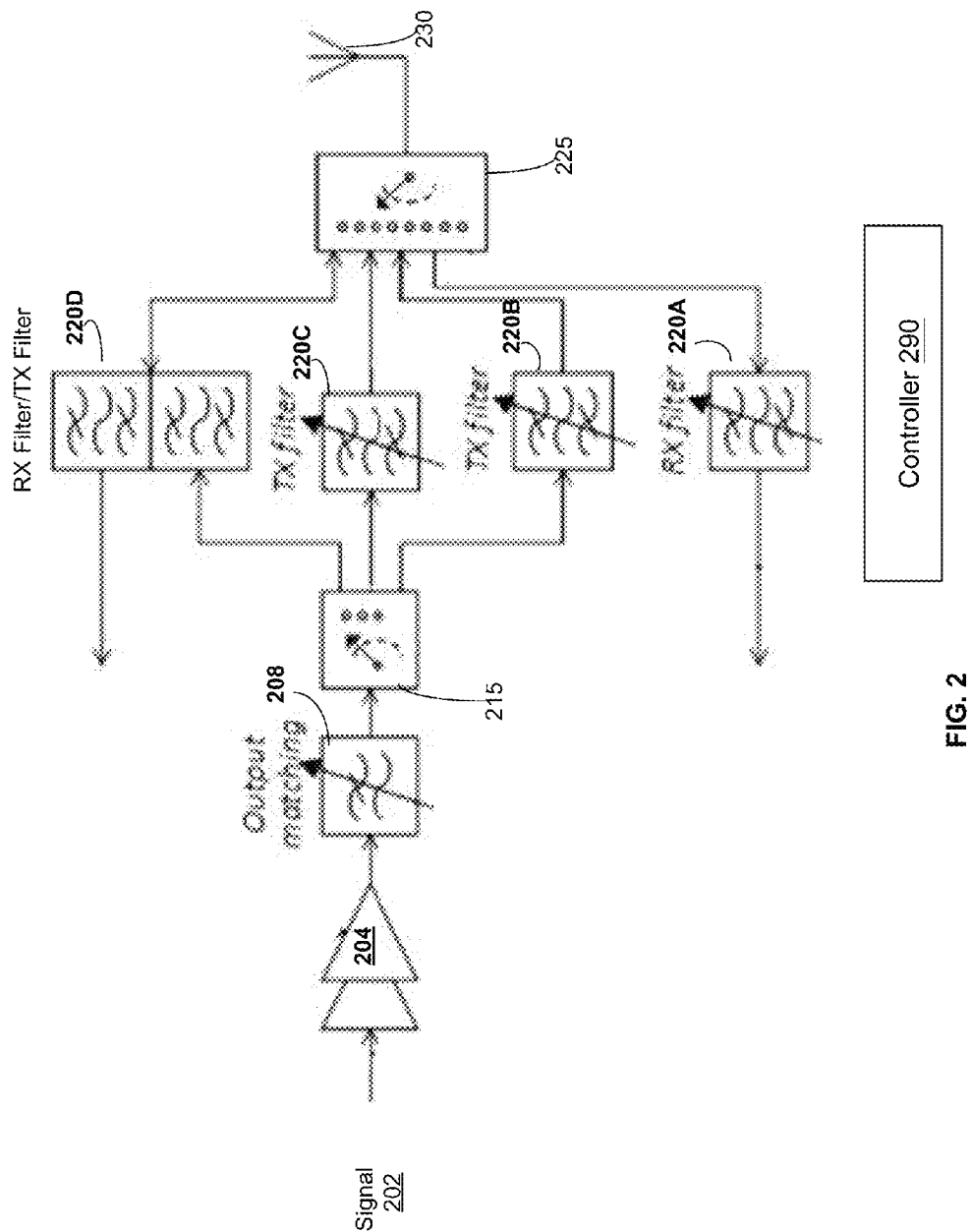
FIG. 2 depicts an example of a radio frequency front-end, in accordance with some example embodiments.

FIG. 2 depicts an example system 200, in accordance with some example embodiments.

The system 200 may include a signal 202 to be transmitted. This signal 202 may be provided as an input to amplifier 204. The output of the amplifier 204 may be provided as an input to a matching filer 208. Matching filter 208 may adjust its output impedance to match that of the filter band that is currently selected by the radio frequency switch 215. The radio frequency switch may be implemented as a switch with one or more contacts which can be controlled to open or close. Moreover, the radio frequency switch may be operative at the frequencies associated with the front-end. Although FIG. 2 depicts an example configuration including a certain quantity of amplifiers, switches, filters, and antennas, other quantifies of these components may be used as well. For example, a plurality of switches and antennas (for example, multi input multi output, MIMO antennas as well as diversity) may be used.

In some example embodiments, the switch 215 may select from among a plurality of band filters 220A-D. Some of the band filters 220A-D may be tunable, such as filters 220A-C, while some filters such as filter 220D may not be tunable. Moreover, the tunable filters may be under the control of a controller 290. And, the band filters may be further coupled to a switch 225 (also referred to herein as an antenna switch), which may select which of the band filters 220A-D to couple to at least one antenna 230.

The bandpass filter 220A, B, C, or D may be implemented as transmit bandpass filter, a receive bandpass filter, or a combination of both. For example, some bandpass filters may include a transmit bandpass and a receive bandpass. Moreover, some bandpass filters may include additional circuitry to perform signal processing including switching, multiplexing, demultiplexing, and/or the like. For example, a frequency division duplex bandpass filter may use different frequencies for transmission and reception. As such, this frequency division duplex bandpass filter may include two bandpass filters and a duplexer to couple the transmit signal to a corresponding bandpass filter and to couple the receive signal to its corresponding bandpass filter.

Although the previous example referred to the frequency division duplex bandpass filter having two bands, other quantities of bands and duplexers may be implemented as well.

Although the example of FIG. 2 depicts a certain quantity of band filters, other quantity of band filters may be implemented as well.

To illustrate by way of operation, the amplifier 204 output signal may be amplified at a sufficient power to enable transmission via antenna 230. The amplifier output signal may comprise a signal modulated on a carrier at a given frequency. As the power amplifier output may be at relatively high transmission powers, the noise leakage at switch 215 may contribute in part to the noise coupling at the switch 215 as well. The frequency of the signal 202 (which may be under the control of controller 290) may also be varied to allow transmission within one of the band filters 220A-D. The controller 290 may establish a transmission path for the amplifier output signal to antenna 230. For example, the controller 290 may adjust the frequency, configure the switch 215 to select one of the bands of band filters 220A-D, and/or configured the antenna switch 225 to couple the selected band filter to the antenna 230. The controller 290 may also control the matching filter 208 to provide the proper output impedance for the band 220A-D selected by distribution switch 215.

In some example embodiments, the controller 290 may select band filter 220D and allow amplifier 204 output signal to pass to antenna switch 225 and antenna 230. While band filter 220D is selected, controller 290 may also tune non-selected tunable band filter 220B, which in this example may have at least a partially overlapping frequency range with selected band filter 220D. In this way, when the amplified signal traverses the switch 215, any leakage via the non-selected band filter 220B will be attenuated or suppressed because the controller 290 has tuned the non-selected band filter 220B to provide attenuation or suppression (for example, by moving the passband of the non-selected band 220B to not overlap with the selected band filter).

To illustrate further with a non-limiting numerical example, the controller 290 may determine to transmit the signal of interest 202 within the pass band of band 7 (which corresponds to 2500-2570 MHz and 2620-2690 MHz). When this is the case, controller 290 may adjust signal 202, so that the amplifier 204 output is in the band 7 passband. Controller 290 may also control switch 215 and antenna switch 225 to select band filter 220D, enabling thus a path to the antenna 230. While band filter 220D is selected, controller 290 may also tune non-selected band filter 220B, which in this example corresponds to band 41 having a passbands at 2496-2690 MHz. In this example, controller 290 may tune non-selected tunable band filter 220B so that the passband of the band filter 220B is not within the passband of selected filter 220D. In some example embodiments, the RF front-end bandpass filter is thus used to suppress the leakage, rather than using higher isolation switches.

At some other point of time, controller 290 may determine that another band is to be used for transmission. When that is the case, the signal 202 may adjusted to a different band that corresponds to for example band filter 220C. When this is the case, controller 290 may select band filter 220C and configured antenna switch 225 to allow the amplified output signal of amplifier 204 to pass to antenna 230. While band filter 220C is selected, controller 290 may also tune any non-selected band filters (which may overlap with selected band filter 220C) to attenuate or suppress any leakage as noted above. If band filter 220C does not overlap with the other band filters, then controller may not tune the other band filters 220A-B to provide the leakage suppression.

Although the previous example refers to transmission band filters, the band filters may correspond to receive band filters. Moreover, although some of the examples refer to specific overlapping Long Term Evolution bands, other cellular bands may overlap as well.

In some example embodiments, the control of the filters may be in accordance with for example a MIPI RF Front-End (RFFE) standard, although other control mechanisms may be used as well.

Figure 3:
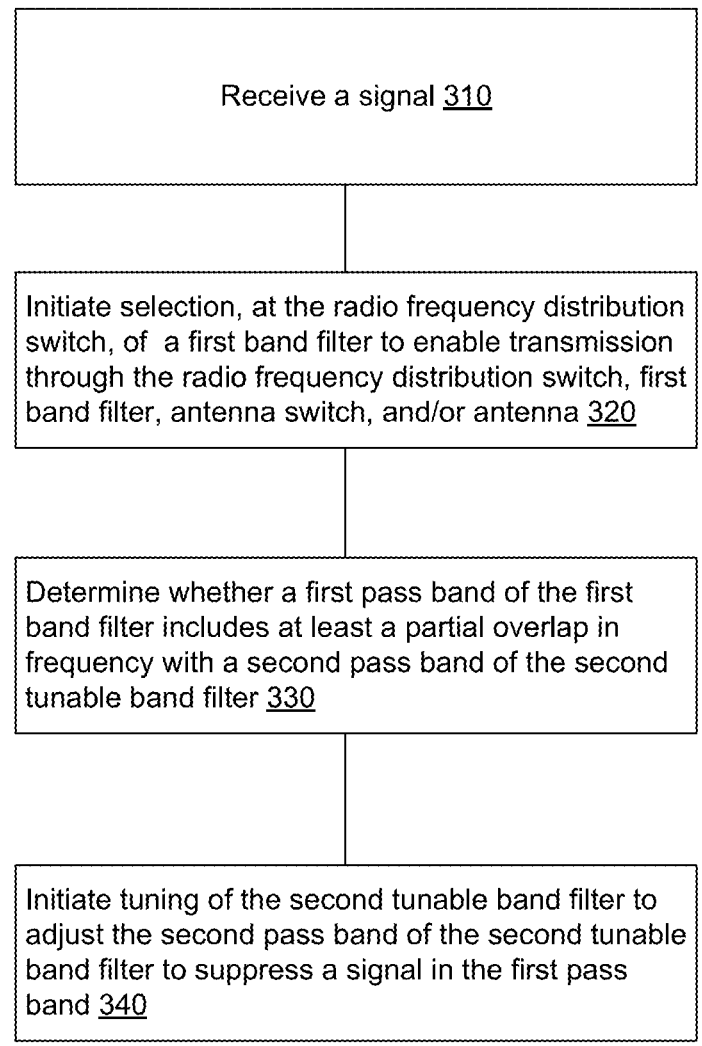
FIG. 3 depicts an example of a process for suppressing noise at a front-end switch, in accordance with some example embodiments.

FIG. 3 depicts an example process 300 for controlling filters to suppress noise, in accordance with some example embodiments.

At 310, a carrier signal including a signal of interest may be received, in accordance with some example embodiments. At 320, the controller may initiate selection, at the radio frequency switch 215, of a first band filter to enable transmission through the radio frequency switch 215, first band filter, antenna switch, and/or antenna, in accordance with some example embodiments. At 330, the controller may determine whether a first pass band of the first band filter includes at least a partial overlap in frequency with a second pass band of the second tunable band filter, in accordance with some example embodiments. If there is at least a partial overlap in frequency, the controller may, at 340, initiate tuning of at least the second tunable band filter (as well as other overlapping band filters) to adjust the second pass band of the second tunable band filter to suppress the leakage signal carried by the first pass band, in accordance with some example embodiments.

Figure 4:
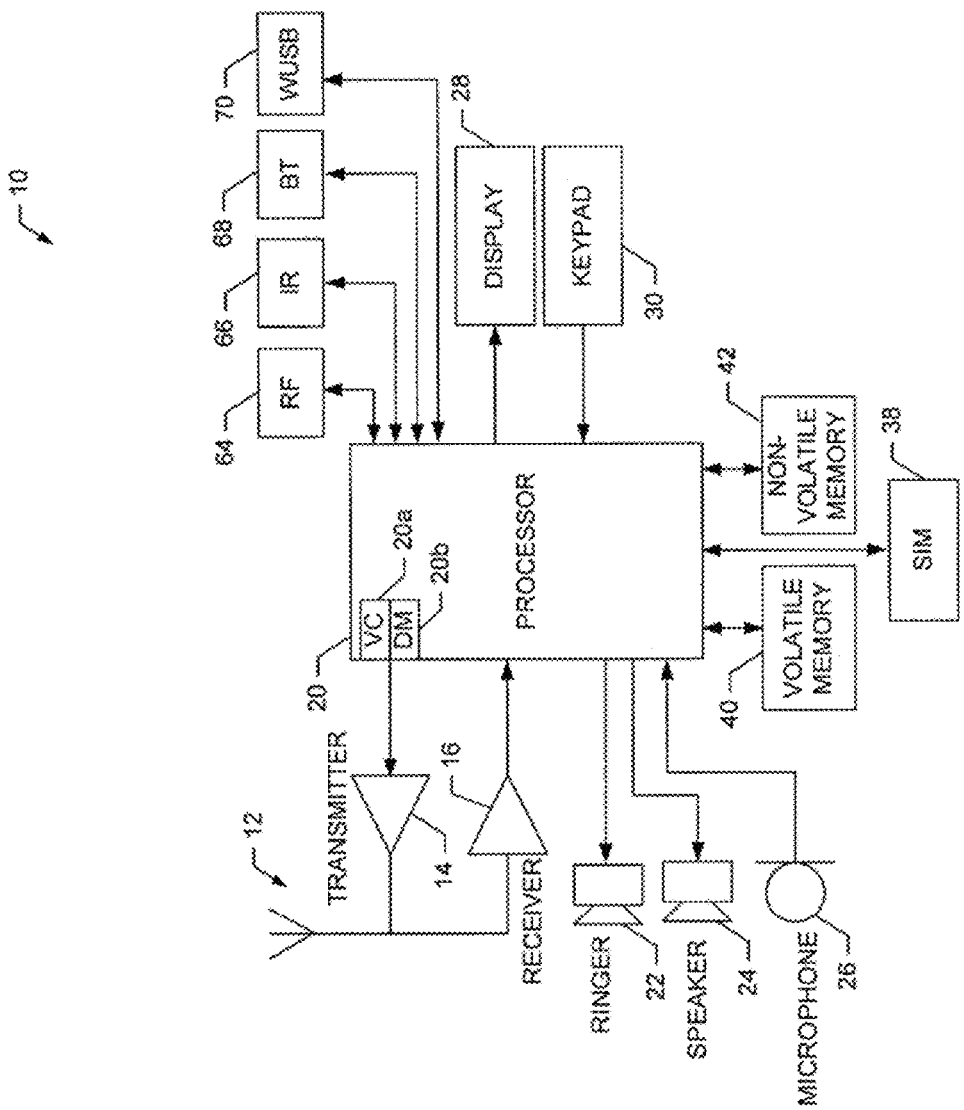
FIG. 4 depicts an example of a radio, in accordance with some example embodiments.

FIG. 4 depicts a block diagram of a radio 10 that may be used as user equipment including the sigma delta receiver, in accordance with some example embodiments.

The radio may include at least one antenna 12 in communication with a transmitter 14 and a receiver 16. Alternatively transmit and receive antennas may be separate.

In some example embodiments, transmitter 14 and/or receiver 16 may include the apparatus 200 (or portions thereof) to provide suppression of leakage noise in the RF front-end.

The apparatus 10 may also include a processor 20 configured to provide signals to and receive signals from the transmitter and receiver, respectively, and to control the functioning of the apparatus. Processor 20 may be configured to control the functioning of the transmitter and receiver by effecting control signaling via electrical leads to the transmitter and receiver. Likewise, processor 20 may be configured to control other elements of apparatus 10 by effecting control signaling via electrical leads connecting processor 20 to the other elements, such as a display or a memory. The processor 20 may, for example, be embodied in a variety of ways including circuitry, at least one processing core, one or more microprocessors with accompanying digital signal processor(s), one or more processor(s) without an accompanying digital signal processor, one or more coprocessors, one or more multi-core processors, one or more controllers, processing circuitry, one or more computers, various other processing elements including integrated circuits (for example, an application specific integrated circuit (ASIC), a field programmable gate array (FPGA), and/or the like), or some combination thereof. Accordingly, although illustrated in FIG. 4 as a single processor, in some example embodiments the processor 20 may comprise a plurality of processors or processing cores.

Signals sent and received by the processor 20 may include signaling information in accordance with an air interface standard of an applicable cellular system, and/or any number of different wireline or wireless networking techniques, comprising but not limited to Wi-Fi, wireless local access network (WLAN) techniques, such as Institute of Electrical and Electronics Engineers (IEEE) 802.11, 802.16, and/or the like. In addition, these signals may include speech data, user generated data, user requested data, and/or the like.

The apparatus 10 may be capable of operating with one or more air interface standards, communication protocols, modulation types, access types, and/or the like. For example, the apparatus 10 and/or a cellular modem therein may be capable of operating in accordance with various first generation (1G) communication protocols, second generation (2G or 2.5G) communication protocols, third-generation (3G) communication protocols, fourth-generation (4G) communication protocols, fifth-generation (5G) communication protocols, Internet Protocol Multimedia Subsystem (IMS) communication protocols (for example, session initiation protocol (SIP) and/or any subsequent revisions or improvements to these standards. For example, the apparatus 10 may be capable of operating in accordance with 2G wireless communication protocols IS-136, Time Division Multiple Access TDMA, Global System for Mobile communications, GSM, IS-95, Code Division Multiple Access, CDMA, and/or the like. In addition, for example, the apparatus 10 may be capable of operating in accordance with 2.5G wireless communication protocols General Packet Radio Service (GPRS), Enhanced Data GSM Environment (EDGE), and/or the like. Further, for example, the apparatus 10 may be capable of operating in accordance with 3G wireless communication protocols, such as Universal Mobile Telecommunications System (UMTS), Code Division Multiple Access 2000 (CDMA2000), Wideband Code Division Multiple Access (WCDMA), Time Division-Synchronous Code Division Multiple Access (TD-SCDMA), and/or the like. The apparatus 10 may be additionally capable of operating in accordance with 3.9G wireless communication protocols, such as Long Term Evolution (LTE), Evolved Universal Terrestrial Radio Access Network (E-UTRAN), and/or the like. Additionally, for example, the apparatus 10 may be capable of operating in accordance with 4G wireless communication protocols, such as LTE Advanced, LTE-Direct, LTE-Unlicensed, and/or the like as well as similar wireless communication protocols that may be subsequently developed.

It is understood that the processor 20 may include circuitry for implementing audio/video and logic functions of apparatus 10. For example, the processor 20 may comprise a digital signal processor device, a microprocessor device, an analog-to-digital converter, a digital-to-analog converter, and/or the like. Control and signal processing functions of the apparatus 10 may be allocated between these devices according to their respective capabilities. The processor 20 may additionally comprise an internal voice coder (VC) 20a, an internal data modem (DM) 20b, and/or the like. Further, the processor 20 may include functionality to operate one or more software programs, which may be stored in memory. In general, processor 20 and stored software instructions may be configured to cause apparatus 10 to perform actions. For example, processor 20 may be capable of operating a connectivity program, such as a web browser. The connectivity program may allow the apparatus 10 to transmit and receive web content, such as location-based content, according to a protocol, such as wireless application protocol, WAP, hypertext transfer protocol, HTTP, and/or the like.

Apparatus 10 may also comprise a user interface including, for example, an earphone or speaker 24, a ringer 22, a microphone 26, a display 28, a user input interface, and/or the like, which may be operationally coupled to the processor 20. The display 28 may, as noted above, include a touch sensitive display, where a user may touch and/or gesture to make selections, enter values, and/or the like. The processor 20 may also include user interface circuitry configured to control at least some functions of one or more elements of the user interface, such as the speaker 24, the ringer 22, the microphone 26, the display 28, and/or the like. The processor 20 and/or user interface circuitry comprising the processor 20 may be configured to control one or more functions of one or more elements of the user interface through computer program instructions, for example, software and/or firmware, stored on a memory accessible to the processor 20, for example, volatile memory 40, non-volatile memory 42, and/or the like. The apparatus 10 may include a battery for powering various circuits related to the mobile terminal, for example, a circuit to provide mechanical vibration as a detectable output. The user input interface may comprise devices allowing the apparatus 20 to receive data, such as a keypad 30 (which can be a virtual keyboard presented on display 28 or an externally coupled keyboard) and/or other input devices.

As shown in FIG. 4, apparatus 10 may also include one or more mechanisms for sharing and/or obtaining data. For example, the apparatus 10 may include a short-range radio frequency (RF) transceiver and/or interrogator 64, so data may be shared with and/or obtained from electronic devices in accordance with RF techniques. The apparatus 10 may include other short-range transceivers, such as an infrared (IR) transceiver 66, a Bluetooth™ (BT) transceiver 68 operating using Bluetooth™ wireless technology, a wireless universal serial bus (USB) transceiver 70, a Bluetooth™ Low Energy transceiver, a ZigBee transceiver, an ANT transceiver, a cellular device-to-device transceiver, a wireless local area link transceiver, and/or any other short-range radio technology. Apparatus 10 and, in particular, the short-range transceiver may be capable of transmitting data to and/or receiving data from electronic devices within the proximity of the apparatus, such as within 10 meters, for example. The apparatus 10 including the Wi-Fi or wireless local area networking modem may also be capable of transmitting and/or receiving data from electronic devices according to various wireless networking techniques, including 6LoWpan, Wi-Fi, Wi-Fi low power, WLAN techniques such as IEEE 802.11 techniques, IEEE 802.15 techniques, IEEE 802.16 techniques, and/or the like.

The apparatus 10 may comprise memory, such as a subscriber identity module (SIM) 38, a removable user identity module (R-UIM), a eUICC, an UICC, and/or the like, which may store information elements related to a mobile subscriber. In addition to the SIM, the apparatus 10 may include other removable and/or fixed memory. The apparatus 10 may include volatile memory 40 and/or non-volatile memory 42. For example, volatile memory 40 may include Random Access Memory (RAM) including dynamic and/or static RAM, on-chip or off-chip cache memory, and/or the like. Non-volatile memory 42, which may be embedded and/or removable, may include, for example, read-only memory, flash memory, magnetic storage devices, for example, hard disks, floppy disk drives, magnetic tape, optical disc drives and/or media, non-volatile random access memory (NVRAM), and/or the like. Like volatile memory 40, non-volatile memory 42 may include a cache area for temporary storage of data. At least part of the volatile and/or non-volatile memory may be embedded in processor 20. The memories may store one or more software programs, instructions, pieces of information, data, and/or the like which may be used by the apparatus to provide the operations disclosed herein including process 300 and/or the like. The memories may comprise an identifier, such as an international mobile equipment identification (IMEI) code, capable of uniquely identifying apparatus 10. The functions may include the operations disclosed herein including the following: initiate selection, at the radio frequency switch, of the first band filter to enable transmission through the radio frequency switch, first band filter, and an antenna, determine whether a first pass band of the first band filter includes at least a partial overlap with a second pass band of the second tunable band filter, and/or initiate tuning of the second tunable band filter to adjust the second pass band of the second tunable band filter to suppress a signal in the first pass band, when the first pass band includes at least the partial overlap in frequency with the second pass band. In the example embodiment, the processor 20 may be configured using computer code stored at memory 40 and/or 42 to perform operations as disclosed herein with respect to process 300 and/or the like.

Some of the embodiments disclosed herein may be implemented in software, hardware, application logic, or a combination of software, hardware, and application logic. The software, application logic, and/or hardware may reside on memory 40, the control apparatus 20, or electronic components, for example. In some example embodiment, the application logic, software or an instruction set is maintained on any one of various conventional computer-readable media. In the context of this document, a "computer-readable medium" may be any non-transitory media that can contain, store, communicate, propagate or transport the instructions for use by or in connection with an instruction execution system, apparatus, or device, such as a computer or data processor circuitry, with examples depicted at FIG. 4, computer-readable medium may comprise a non-transitory computer-readable storage medium that may be any media that can contain or store the instructions for use by or in connection with an instruction execution system, apparatus, or device, such as a computer.

In some example embodiments, when a transmission is taking place through a static or a tunable filter, all of the tunable filters not being used may be tuned to a state where the filters do not share a passband with the currently selected filter being used for transmission.

Without in any way limiting the scope, interpretation, or application of the claims appearing herein, a technical effect of one or more of the example embodiments disclosed herein may include suppression of the noise leakage, enhanced isolation or rejection for a selected passband being used for transmission, and/or reduced noise leakage or coupling as noted above.

Without in any way limiting the scope, interpretation, or application of the claims appearing herein, a technical effect of one or more of the example embodiments disclosed herein may include the use of switches having relaxed (lower, for example) isolation requirements.

Without in any way limiting the scope, interpretation, or application of the claims appearing herein, a technical effect of one or more of the example embodiments disclosed herein may include the use of envelope tracking power amplifier, despite the relative noisy nature of that amplifier.

The subject matter described herein may be embodied in systems, apparatus, methods, and/or articles depending on the desired configuration. For example, the base stations and user equipment (or one or more components therein) and/or the processes described herein can be implemented using one or more of the following: a processor executing program code, an application-specific integrated circuit (ASIC), a digital signal processor (DSP), an embedded processor, a field programmable gate array (FPGA), and/or combinations thereof. These various implementations may include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device. These computer programs (also known as programs, software, software applications, applications, components, program code, or code) include machine instructions for a programmable processor, and may be implemented in a high-level procedural and/or object-oriented programming language, and/or in assembly/machine language. As used herein, the term "computer-readable medium" refers to any computer program product, machine-readable medium, computer-readable storage medium, apparatus and/or device (for example, magnetic discs, optical disks, memory, Programmable Logic Devices (PLDs)) used to provide machine instructions and/or data to a programmable processor, including a machine-readable medium that receives machine instructions. Similarly, systems are also described herein that may include a processor and a memory coupled to the processor. The memory may include one or more programs that cause the processor to perform one or more of the operations described herein.

Although a few variations have been described in detail above, other modifications or additions are possible. In particular, further features and/or variations may be provided in addition to those set forth herein. Moreover, the implementations described above may be directed to various combinations and subcombinations of the disclosed features and/or combinations and subcombinations of several further features disclosed above. Other embodiments may be within the scope of the following claims.

The different functions discussed herein may be performed in a different order and/or concurrently with each other. Furthermore, one or more of the above-described functions may be optional or may be combined. Although various aspects of the invention are set out in the independent claims, other aspects of the invention comprise other combinations of features from the described embodiments and/or the dependent claims with the features of the independent claims, and not solely the combinations explicitly set out in the claims. It is also noted herein that while the above describes example embodiments of the invention, these descriptions should not be viewed in a limiting sense. Rather, there are several variations and modifications, which may be made without departing from the scope of the present invention as, defined in the appended claims. The term "based on" includes "based on at least."

What is claimed:

1. An apparatus comprising:
   a first band filter;
   a second tunable band filter;
   a radio frequency switch coupled to at least the first band filter and the second tunable band filter, wherein the radio frequency switch is configured to switch between at least the first band filter and the second tunable band filter; and
   a controller configured to at least:
      initiate selection, at the radio frequency switch, of the first band filter to enable transmission through the radio frequency switch, the first band filter, and an antenna,
      determine whether a first pass band of the first band filter includes at least a partial overlap in frequency with a second pass band of the second tunable band filter, and
      initiate tuning of the second tunable band filter to adjust the second pass band of the second tunable band filter to suppress a leakage signal caused in part by the partial overlap enabling the leakage signal to traverse through the switch and the second tunable band filter which is not selected by the switch, when the first pass band includes at least the partial overlap in frequency with the second pass band.

2. The apparatus of claim 1, wherein the controller is further configured to at least:
   inhibit tuning of the second tunable band filter, when the first pass band does not have the partial overlap in frequency with the second pass band.

3. The apparatus of claim 1 further comprising:
   an antenna switch coupled to at least the first band filter and the second tunable band filter, wherein the antenna switch is configured to switch between at least the first band filter and the second tunable band filter in order couple to the antenna.

4. The apparatus of claim 1, wherein the first band filter is tunable.

5. The apparatus of claim 1, wherein at least one of the first band filter or the second band filter comprise a filter which is at least partially specified by at least one of a standard or a regulatory agency.

6. The apparatus of claim 1, wherein the leakage signal represents a signal of interest that couples to an unselected switch path at the radio frequency switch.

7. The apparatus of claim 1, wherein at least one of the first band filter or the second band filter comprise a transmit bandpass filter, a receive bandpass filter, or a combination of both.

8. The apparatus of claim 1, wherein the radio frequency switch is coupled to at least one additional band filter to enable path establishment to the antenna.

9. A method comprising:
   receiving, at a radio frequency switch, a signal, the radio frequency switch coupled to at least a first band filter and a second tunable band filter, wherein the radio frequency switch is configured to switch between at least the first band filter and the second tunable band filter;
   controlling, the radio frequency switch, to at least:
      initiate selection, at the radio frequency switch, of the first band filter to enable transmission through the radio frequency switch, the first band filter, and an antenna,
      determine whether a first pass band of the first band filter includes at least a partial overlap in frequency with a second pass band of the second tunable band filter, and
      initiate tuning of the second tunable band filter to adjust the second pass band of the second tunable band filter to suppress a leakage signal caused in part by the partial overlap enabling the leakage signal to traverse through the switch and the second tunable band filter which is not selected by the switch, when the first pass band includes at least the partial overlap in frequency with the second pass band.

10. The method of claim of claim 9, wherein the controlling further comprises:
    inhibiting tuning of the second tunable band filter, when the first pass band does not have the partial overlap in frequency with the second pass band.

11. The method of claim 9 further comprising:
    switching, at an antenna switch, between at least the first band filter and the second tunable band filter in order couple to the antenna, wherein the antenna switch is coupled to at least the first band filter and the second tunable band filter.

12. The method of claim 9, wherein the first band filter is tunable.

13. The method of claim 9, wherein at least one of the first band filter or the second band filter comprise a filter which is at least partially specified by at least one of a standard or regulatory agency.

14. The method of claim 9, wherein the leakage signal represents a signal of interest that couples to an unselected switch path at the radio frequency switch.

15. The method of claim 9, wherein at least one of the first band filter or the second band filter comprise a transmit bandpass filter, a receive bandpass filter, or a combination of both.

16. The method of claim 9, wherein the radio frequency switch is coupled to at least one additional band filter to enable path establishment to the antenna.

17. A non-transitory computer-readable storage medium including program code which when executed by at least one processor circuit provides operations comprising:

receiving, at a radio frequency switch, a signal, the radio frequency switch coupled to at least a first band filter and a second tunable band filter, wherein the radio frequency switch is configured to switch between at least the first band filter and the second tunable band filter;

controlling, the radio frequency switch, to at least:
  initiate selection, at the radio frequency switch, of the first band filter to enable transmission through the radio frequency switch, the first band filter, and an antenna,
  determine whether a first pass band of the first band filter includes at least a partial overlap in frequency with a second pass band of the second tunable band filter, and
  initiate tuning of the second tunable band filter to adjust the second pass band of the second tunable band filter to suppress a leakage signal caused in part by the partial overlap enabling the leakage signal to traverse through the switch and the second tunable band filter which is not selected by the switch, when the first pass band includes at least the partial overlap in frequency with the second pass band.

\* \* \* \* \*